(12) United States Patent
Chen et al.

(10) Patent No.: US 11,063,013 B2
(45) Date of Patent: Jul. 13, 2021

(54) SEMICONDUCTOR PACKAGE STRUCTURE

(71) Applicant: Advanced Semiconductor Engineering, Inc., Kaohsiung (TW)

(72) Inventors: Chi-Han Chen, Kaohsiung (TW); Hung-Yi Lin, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/413,480

(22) Filed: May 15, 2019

(65) Prior Publication Data

US 2020/0365544 A1    Nov. 19, 2020

(51) Int. Cl.
| | |
|---|---|
| H01L 23/00 | (2006.01) |
| H01L 25/18 | (2006.01) |
| H01L 23/538 | (2006.01) |
| H01L 23/498 | (2006.01) |
| G02B 6/30 | (2006.01) |
| G02B 6/42 | (2006.01) |

(52) U.S. Cl.
CPC .............. *H01L 24/17* (2013.01); *G02B 6/30* (2013.01); *H01L 23/49816* (2013.01); *H01L 23/5385* (2013.01); *H01L 24/16* (2013.01); *H01L 25/18* (2013.01); *H01L 2224/16227* (2013.01); *H01L 2224/17177* (2013.01)

(58) Field of Classification Search
CPC ......... H01L 24/17; H01L 24/16; H01L 24/10; H01L 24/15; H01L 23/49816; H01L 25/18; G02B 6/30
See application file for complete search history.

(56) References Cited

U.S. PATENT DOCUMENTS

| | | | |
|---|---|---|---|
| 9,059,107 B2 | 6/2015 | Pan et al. | |
| 2015/0235990 A1* | 8/2015 | Cheng | H01L 24/97 257/712 |
| 2018/0211929 A1 | 7/2018 | Bae et al. | |
| 2019/0103386 A1* | 4/2019 | Chen | H01L 21/56 |
| 2019/0131273 A1* | 5/2019 | Chen | H01L 25/16 |
| 2020/0006088 A1* | 1/2020 | Yu | H01L 23/3121 |
| 2020/0105653 A1* | 4/2020 | Elsherbini | H01L 23/645 |

* cited by examiner

*Primary Examiner* — Marcos D. Pizarro
*Assistant Examiner* — Antonio B Crite
(74) *Attorney, Agent, or Firm* — Foley & Lardner LLP

(57) ABSTRACT

A semiconductor package structure includes a first semiconductor die having an active surface and a passive surface opposite to the active surface, a conductive element leveled with the first semiconductor die, a first redistribution layer (RDL) being closer to the passive surface than to the active surface, a second RDL being closer to the active surface than to the passive surface, and a second semiconductor die over the second RDL and electrically coupled to the first semiconductor die through the second RDL. A first conductive path is established among the first RDL, the conductive element, the second RDL, and the active surface of the first semiconductor die.

18 Claims, 7 Drawing Sheets

SEMICONDUCTOR PACKAGE STRUCTURE

BACKGROUND

1. Technical Field

The present disclosure relates to a semiconductor package structure for high speed signal transmission.

2. Description of the Related Art

Silicon photonics or optical engine all specify high speed data rate, or high speed signal transmission. Comparative signal transmission path in a chip-on-chip (CoC) package includes a copper pillar in a flip chip bonding of an upper chip (usually smaller in width) to a lower chip (usually wider in width), lower chip signal line, and wire-bonding of the lower chip signal line to conductive terminals of a substrate carrying the lower chip and the upper chip.

Alternatively, comparative signal transmission path in a chip-on-chip (CoC) package includes a copper pillar in a flip chip bonding of an upper chip (usually smaller in width) to a lower chip (usually wider in width), lower chip conductive pad, lower chip tall pillar, lower chip redistribution layer (RDL) to conductive terminals (usually C4 bump), and then conductive pad of a substrate carrying the lower chip and the upper chip.

The constraint of comparative wire bonding signal transmission is that the high impedance caused by the extended transmission path prevents high speed data rate, for example, 100 Gbit/s, 400 Gbit/s, or 1.6 Tbit/s, from realization. In addition, silicon photonics and optical engine usually specify high speed data rate with the integration of at least an electronic IC (EIC) and a photonic IC (PIC).

SUMMARY

In some embodiments, the present disclosure provides a semiconductor package structure, including a first semiconductor die having an active surface and a passive surface opposite to the active surface, a conductive element leveled with the first semiconductor die, a first redistribution layer (RDL) being closer to the passive surface than to the active surface, a second RDL being closer to the active surface than to the passive surface, and a second semiconductor die over the second RDL and electrically coupled to the first semiconductor die through the second RDL. A first conductive path is established among the first RDL, the conductive element, the second RDL, and the active surface of the first semiconductor die.

In some embodiments, the present disclosure provides a semiconductor package structure, including a first semiconductor die having an active surface and a passive surface opposite to the active surface, a conductive element leveled with the first semiconductor die, a first redistribution layer (RDL) being closer to the passive surface than to the active surface, a second RDL being closer to the active surface than to the passive surface, and a second semiconductor die over the second RDL and electrically coupled to the first semiconductor die through the second RDL. The second semiconductor die comprises a waveguide layer.

In some embodiments, the present disclosure provides a fan-out package structure, including a substrate, a first package over the substrate, and a second package over the first package. The first package has a first semiconductor die, a fan-out redistribution layer (RDL) electrically coupled to an active surface of the first semiconductor die, a high bump density region on the first semiconductor die, and a low bump density region adjacent to the first semiconductor die. The fan-out RDL electrically couples the high bump density region and the low bump density region.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

DETAILED DESCRIPTION

Figure 1A:
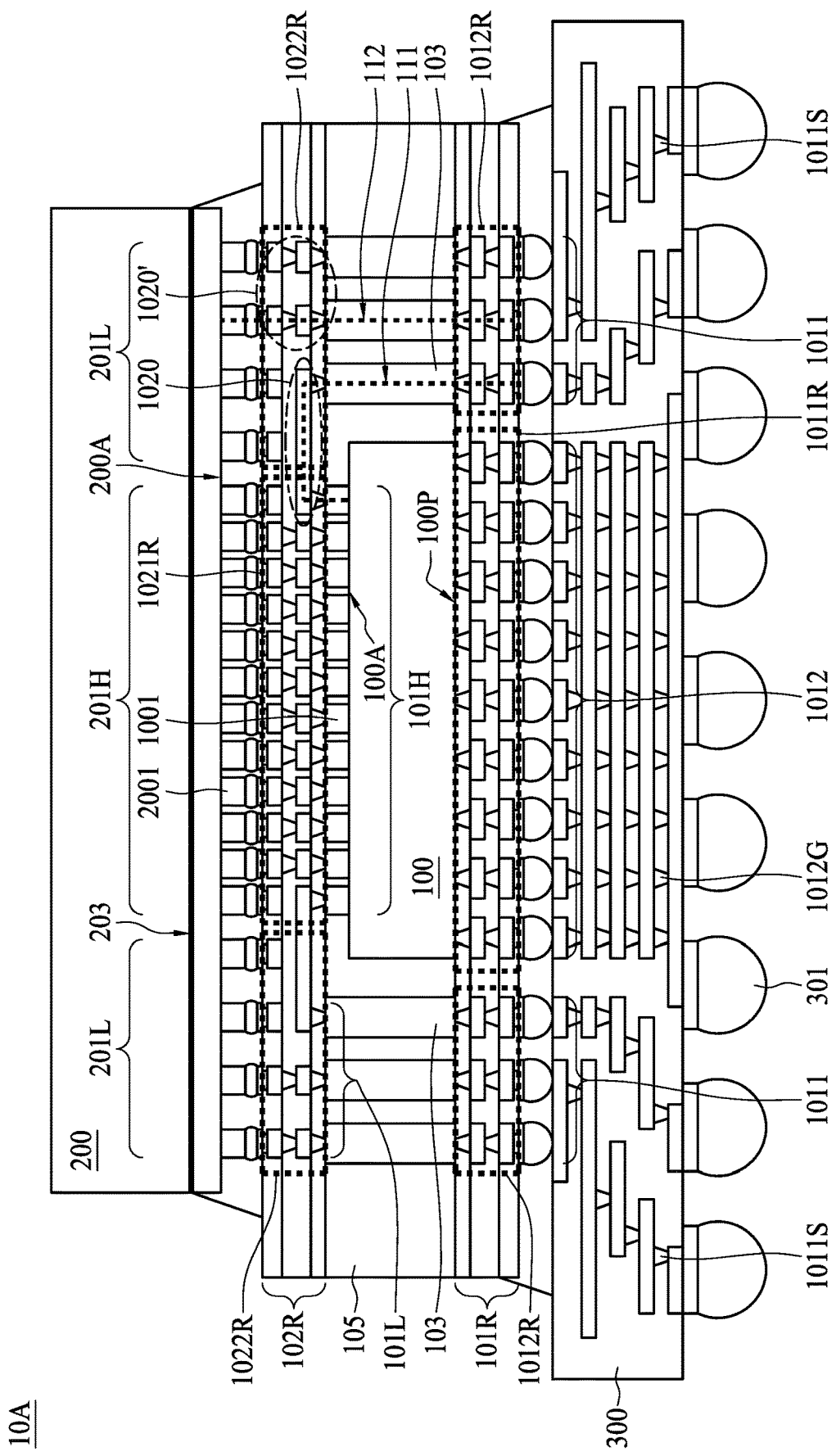
FIG. 1A illustrates a cross-sectional view of a semiconductor package structure according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Present disclosure provides a fan-out package-on-package semiconductor package structure realizing high speed signal transmission, for example, greater than 400 Gbit/s. At least one of the electrical signals is first sent to a first IC for amplification, and then arriving at a second IC. The signal transmission path is designed in the package to have suitable impedance allowing the aforesaid high speed signal transmission.

Referring to FIG. 1A, FIG. 1A illustrates a cross-sectional view of a semiconductor package structure 10A according to some embodiments of the present disclosure. The semiconductor package structure 10A includes a carrier 300 having a plurality of conductive terminals 301 configured to connect to an external electronic apparatus like a printed circuit board (PCB) or a main board via contacts (not shown) disposed at the bottom of the substrate 300. In some embodiments, the conductive terminals 301 may be positioned at a bottom surface of the carrier 300, while a top surface of the carrier 300 faces a redistribution layer 101R. The carrier 300 may include a prepreg which is a hard resin having high glass transition temperature (Tg) such as glass epoxy resin, bismaleimide-triazine (BT) resin or epoxy resin, or can be a substrate used in the art, such as FR-4 substrate, FR-5 substrate and BT substrate. Patterned conductive layers in the substrate 300 can be made of copper by using a photographic process, for example. Conductive pads on the top surface of the substrate 300 may be electrically connected to the conductive terminals 301 at the bottom surface through, for example, a ground line 1012G or a signal line 1011S of the patterned conductive layer.

Referring to FIG. 1, the semiconductor package structure 10A may include a first semiconductor die 100 and a second semiconductor die 200. The first semiconductor die 100 has an active surface 100A and a passive surface 100P opposite to the active surface 100A. The active surface 100A of the first semiconductor die 100 is the surface formed with the active devices (not shown) of the first semiconductor die 100. Conductive bumps 1001 are in proximity to, adjacent to, or embedded in and exposed at active surface 100A, serving as a medium for signal input/output, wherein each conductive bumps 1001 electrically and mechanically connects a bonding pad (not shown) of the first semiconductor die 100 and the redistribution layer (RDL) 102R. Thereby, the signals from the first semiconductor die 100 can be transmitted to the second semiconductor die 200 via the conductive bumps 1001 and the RDL 102R.

As illustrated in FIG. 1A, a plurality of conductive elements 103 are disposed beside, or leveled with, the first semiconductor die 100. By leveling with the first semiconductor die 100, a bottom of each of the conductive elements may be coplanar with a bottom of the first semiconductor die 100. In some embodiments, a bottom of each of the conductive elements and a bottom of the first semiconductor die 100 are both disposed on a top surface of the RDL 101R. In some embodiments, molding compound 105 encapsulates the first semiconductor die 100 and the conductive elements 103. In some embodiments, the conductive element 103 can be a copper pillar or a through package via (TPV). RDL 102R over the first semiconductor die 100 is disposed to be closer to the active surface 100A than the passive surface 100P. RDL 101R under the first semiconductor die 100 is disposed to be closer to the passive surface 100P than the active surface 100A. Substrate 300 is disposed to be closer to the passive surface 100P than the active surface 100A. Conductive traces 1021R and 1022R in the RDL 102R can be configured in a fan-out structure with respect to the first semiconductor die 100, in which a projection area of the conductive trances 1021R and 1022R in the RDL 102R may be greater than a projection area of the first semiconductor die 100. Conductive traces 1011R in the RDL 101R may be connected to the passive surface 100P of the first semiconductor die 100. Conductive traces 1012R in the RDL 101R may be connected to the bottom of the conductive elements 103 encapsulated in the molding compound 105.

By having the electrical connection exemplified in FIG. 1A, the signals from the conductive terminals 301 can be transmitted to the RDL 101R via signal line 1011S in the substrate 300 and the conductive terminal 1011. The signals may be further transmitted from the RDL 101R to the first semiconductor die 100 via conductive element 103, RDL 102R, and conductive bump 1001 at the active surface 100A of the first semiconductor die 100. Similarly, the signal may be further transmitted from the first semiconductor die 100 to the second semiconductor die 200 via the RDL 102R, as previously discussed.

In some embodiments, by having the electrical connection exemplified in FIG. 1A, the signals from the conductive terminals 301 can be transmitted to the conductive traces 1012R of the RDL 101R via signal line 1011S in the substrate 300 and via the conductive terminal 1011, for example, C4 bumps. The conductive terminal 1011 can be C4 bumps electrically coupled to conductive traces 1012R in the RDL 101R and then to conductive elements 103. The signals may be further transmitted from the RDL 101R to the first semiconductor die 100, along conductive path 111 (shown in dotted lines) via conductive element 103, conductive traces 1020 of RDL 102R, and conductive bump 1001 at the active surface 100A of the first semiconductor die 100. For instance, conductive path 111 carrying the aforesaid signal may include a conductive trace 1020 electrically coupling the conductive element 103 and the conductive bump 1001 of the first semiconductor die 100. In some embodiments, the conductive trace 1020 is a conductive line laterally coupling conductive vias that connect the conductive element 103 and the conductive bump 1001, respectively. Similarly, the signal may be further transmitted from the first semiconductor die 100 to the second semiconductor die 200 via the conductive trace 1021R of the RDL 102R, as previously discussed. The conductive trace 1021R may include a routing design that minimize the impedance of the conductive path between the first semiconductor die 100 and the second semiconductor die 200. In some embodiments, the conductive trace 1021R may include a routing design that minimize the conductive path length between the first semiconductor die 100 and the second semiconductor die 200.

By having the electrical connection exemplified in FIG. 1A, the signals from the conductive terminals 301 can be transmitted to the RDL 101R via signal line 1011S in the substrate 300 and the conductive terminal 1011. The signals may be further transmitted from the RDL 101R to the second semiconductor die 200 via conductive element 103, RDL 102R, and conductive bump 2001 in proximity to, adjacent to, or embedded in and exposed at active surface 200A of the second semiconductor die 200.

In some embodiments, by having the electrical connection exemplified in FIG. 1A, the signals from the conductive terminals 301 can be transmitted to the conductive traces 1012R of the RDL 101R via signal line 1011S in the substrate 300 and via the conductive terminal 1011, for example, C4 bumps. The conductive terminal 1011 can be C4 bumps electrically coupled to conductive traces 1012R in the RDL 101R and then to conductive elements 103. The signals may be further transmitted from the RDL 101R to the second semiconductor die 200, along conductive path 112 (shown in dotted lines) via conductive element 103, conductive traces 1020' of RDL 102R, and conductive bump 2001 at the active surface 200A of the second semiconductor die 200. For instance, conductive path 112 carrying the aforesaid signal may include a conductive trace 1020' electrically coupling the conductive element 103 and the conductive bump 2001 of the second semiconductor die 200. In some embodiments, the conductive trace 1020' includes a conductive vias and conductive patterns vertically coupling the conductive element 103 and the conductive bump 2001, respectively. The conductive trace 1020' may include a routing design that minimize the impedance of the conductive path between the second semiconductor die 200 and conductive element 103. In some embodiments, the conductive trace 1020' may include a routing design that minimize the conductive path length between the second semiconductor die 200 and conductive element 103.

In some embodiments, the conductive path 111 and the conductive path 112 may include conductive trace 1012R in the RDL 101R. In some embodiments, the conductive trace 1012R includes a conductive vias and conductive patterns vertically coupling the conductive element 103 and the conductive terminals 1011. The conductive trace 1012R may include a routing design that minimizes the impedance of the conductive path between the conductive element 103 and the conductive terminals 1011. In some embodiments, the conductive trace 1012R may include a routing design that minimizes the conductive path length between the conductive element 103 and the conductive terminals 1011.

In some embodiments, the conductive terminals between the RDL 101R and the substrate 300 may be grouped into conductive terminals 1011 of a first type and conductive terminals 1012 of a second type. The conductive terminals 1011 may be located under a projected area of the second semiconductor die 200 but not under a projected area of the first semiconductor die 100. The conductive terminals 1011 may further electrically connect to signal lines 1011S in the substrate 300, where the signal lines 1011S may be further electrically connect to external electronic apparatus like a printed circuit board (PCB) or a main board via contacts (not shown) through conductive terminals 301 under the substrate 300. The conductive terminals 1012 may be located under a projected area of the first semiconductor die 100 but not under a projected area of the second semiconductor die 200. The conductive terminals 1012 may further electrically connect to ground lines, or floating lines, 1012G in the substrate 300, where the ground lines or floating lines 1012G may be further connect to external electronic apparatus like a printed circuit board (PCB) or a main board via contacts (not shown) through conductive terminals 301 under the substrate 300. When the semiconductor package structure 10A is under operation, the signal lines 1011S may be configured to transmit electronic signal from the external electronic apparatus to the first semiconductor die 100 and the second semiconductor die 200. When the semiconductor package structure 10A is under operation, the ground lines or floating lines 1012G may be configured as a heat dissipation path of the first semiconductor die 100. In some embodiments. In some embodiments, the first semiconductor die 100 may consume greater electric power than the second semiconductor die 200 does, therefore, ground lines or floating lines 1012G may function as thermal vias to foster the heat dissipation of the first semiconductor die 100. In some embodiments, the first semiconductor die 100 may consume substantially identical electric power than the second semiconductor die 200 does, however, since the first semiconductor die 100 is encapsulated in the molding compound 105 rather than being exposed to medium with greater thermal conductivity than the molding compound 105, ground lines or floating lines 1012G may function as thermal vias to foster the heat dissipation of the first semiconductor die 100.

Referring to FIG. 1A, second semiconductor die 200 may include conductive bumps 2001 at the active surface 200A. The conductive bumps 2001 may be grouped into a high bump density region 201H and a low bump density region 201L. In some embodiments, high bump density region 201H may possess a greater number of conductive bumps 2001 per area from a top view perspective than the low bump density region 201L. In some embodiments, high bump density region 201H may possess a greater number of conductive bumps 2001 per length from a cross sectional view perspective than the low bump density region 201L.

As illustrated in FIG. 1A, second semiconductor die 200 is electrically connected to the first semiconductor die 100 through the conductive bumps 2001 in the high bump density region 201H as a result of matching the pattern of the conductive bumps 1001 on the active surface 100A of the first semiconductor die 100 with substantially vertical conductive traces 1021R in the RDL 102R. Second semiconductor die 200 is electrically connected to RDL 101R through the conductive bumps 2001 in the low bump density region 201L as a result of matching the pattern of the conductive elements 103 with substantially vertical conductive traces 1022R in the RDL 102R.

Figure 1B:
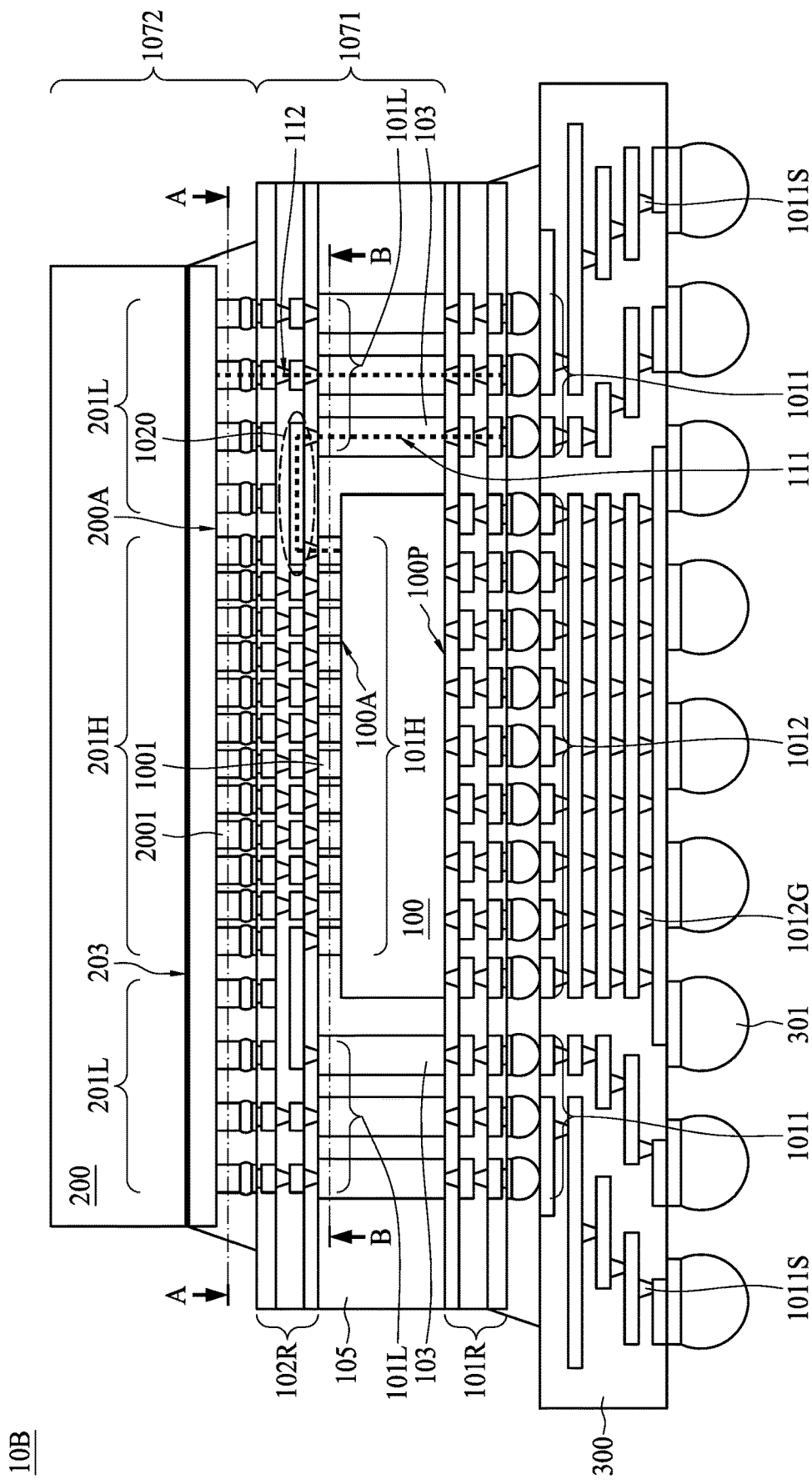
FIG. 1B illustrates a cross-sectional view of a semiconductor package structure according to some embodiments of the present disclosure.

Referring to FIG. 1B, first semiconductor package 1071, including the first semiconductor die 100, the conductive elements 103, and the molding compound 105, may include conductive bumps 1001 at the active surface 100A and conductive bumps, or previously denoted conductive elements 103, disposed adjacent to the first semiconductor die 100. Conductive bumps in the first semiconductor package 1071 may be grouped into a high bump density region 101H and a low bump density region 101L. In some embodiments, high bump density region 101H may possess a greater number of conductive bumps 1001 per area from a top view perspective than the low bump density region 101L. In some embodiments, high bump density region 101H may possess a greater number of conductive bumps 1001 per length from a cross sectional view perspective than the low bump density region 101L.

As illustrated in FIG. 1A, the conductive bumps 1001 in the high bump density region 101H matches with the pattern of the conductive bumps 2001 in the high bump density region 201H with substantially vertical conductive traces 1021R. Conductive bumps, or previously denoted conductive elements 103, in the low bump density region 101L matches with the pattern of the conductive bumps 2001 in the low bump density region 201L with substantially vertical conductive traces 1022R. Alternatively stated, conductive bumps 1001 in the high bump density region 101H match with the pattern of the substantially vertical conductive traces 1021R, whereas conductive bumps, or previously denoted conductive elements 103, in the low bump density region 101L match with the pattern of the substantially vertical conductive traces 1022R.

Referring to FIG. 1A, the semiconductor package structure 10A includes a second semiconductor die 200 having a wider cross section than the first semiconductor die 100. In some embodiments, the second semiconductor die 200 possesses a greater die area than the first semiconductor die 100 from a top view perspective. In one aspect, a projected area of the second semiconductor die 200 covers not only the first semiconductor die 100 but also the conductive elements 103 surrounding the first semiconductor die 100. Accordingly, the conductive bumps 2001 of the second semiconductor die 200 may be positioned over not only the first semiconductor die 100 but also the conductive elements 103 surrounding the first semiconductor die 100.

In some embodiments, the first semiconductor die 100 may be an electronic integrated circuit (EIC) while the second semiconductor die 200 may be a photonic integrated circuit (PIC). For example, EIC may include both active semiconductor devices and passive circuit components and the electrically conductive paths interconnecting the active semiconductor devices and passive circuit components in electrical circuit relationships for performing a desired sub-circuit control function. PIC may include a combination of photonic devices in a circuit on a single substrate to achieve a desired function. For example, PIC may include lasers, receivers, waveguides, detectors, semiconductor optical amplifiers (SOA), gratings, and other active and passive semiconductor optical devices on a single substrate.

Referring to FIG. 1B, FIG. 1B illustrates a cross-sectional view of a fan-out package structure 10B according to some embodiments of the present disclosure. Fan-out package structure 10B may be substantially similar to the semiconductor package structure 10A of FIG. 1A except for the second semiconductor die 200 including a waveguide layer 203. In some embodiments, the second semiconductor die 200 of fan-out package structure 10B can be a PIC having a waveguide layer 203 in proximal to the active surface 200A. In some embodiments, the waveguide layer 203 may possess a greater refractive index than that of the cladding layer (not shown) surrounding the waveguide layer. For example, a waveguide layer may include a plurality of waveguides, or optical channels. Each of the optical channels has a center wavelength (e.g., 1.48 μm, 1.52 μm, 1.55 μm, etc.), each optical channel is typically assigned a minimum channel spacing or bandwidth to avoid crosstalk with other optical channels.

Also illustrated in FIG. 1B includes a fan-out package structure 10B having a first package 1071 and a second package 1072 stacked over the first package 1071. In some embodiments, the first package 1071 includes a first semiconductor die 100 and a fan-out RDL 102R electrically coupling the active surface 100A and the active surface 200A. As previously discussed, second package 1072 includes a high bump density region 201H and a low bump density region 201L located at the active surface 200A of the second semiconductor die 200. Similarly, first package 1071 includes a high bump density region 101H at the active surface 100A of the first semiconductor die 100 and a low bump density region 101L at the conductive elements 103. At least one of the conductive traces 1020 in the fan-out RDL 102R electrically couples the low bump density region 101L to the high bump density region 101H. In some embodiments, the at least one of the conductive traces 1020 in the fan-out RDL 102R forms a portion of the conductive path 111 previously described, where the signal can be transmitted from the conductive terminal 1011 to the active surface of the first semiconductor die 100 through the conductive elements 103 and the at least one conductive trace 1020.

Figure 1C:
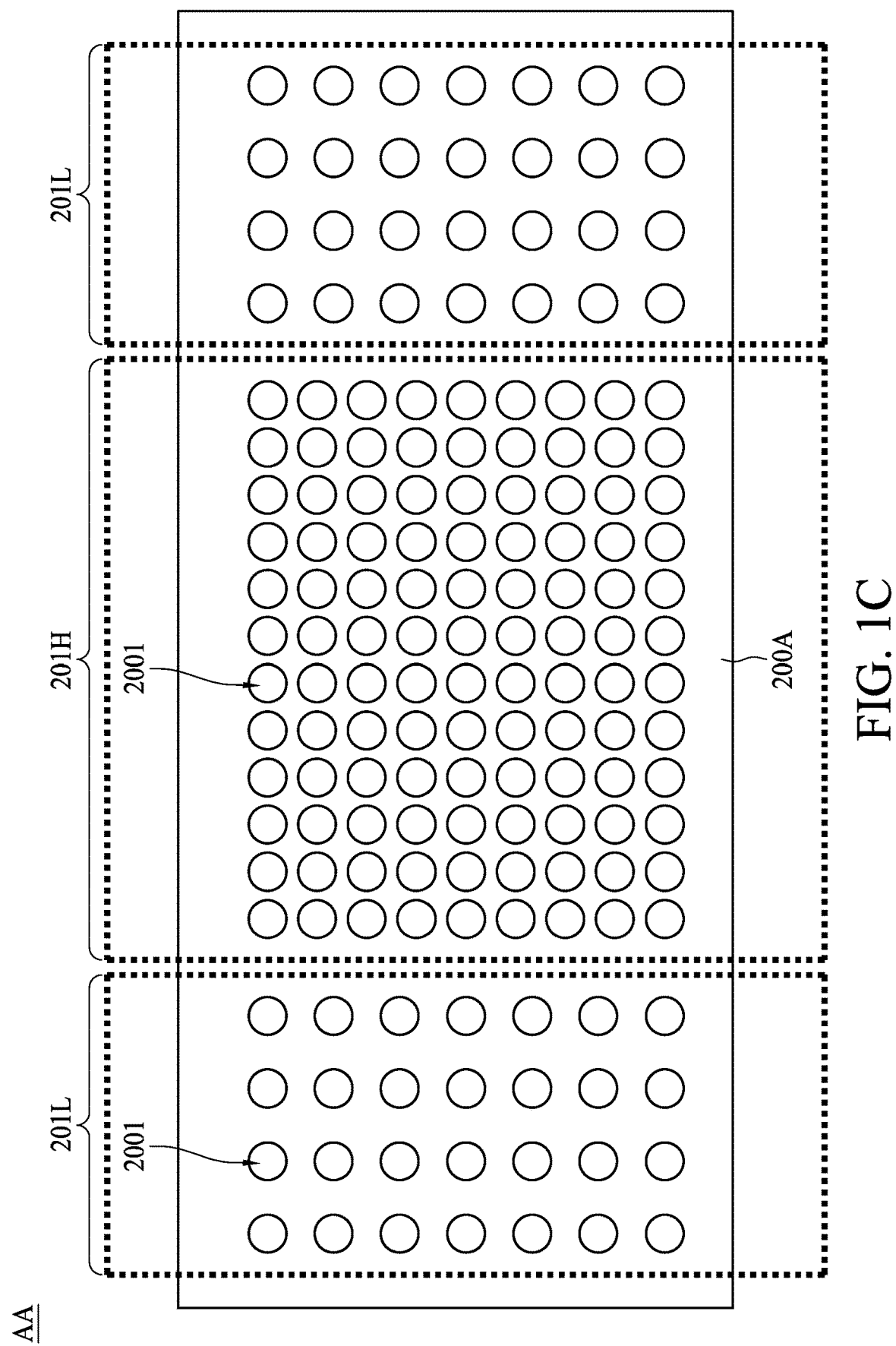
FIG. 1C illustrates a bottom perspective of an upper package along line AA in FIG. 1B, according to some embodiments of the present disclosure.
Figure 1D:
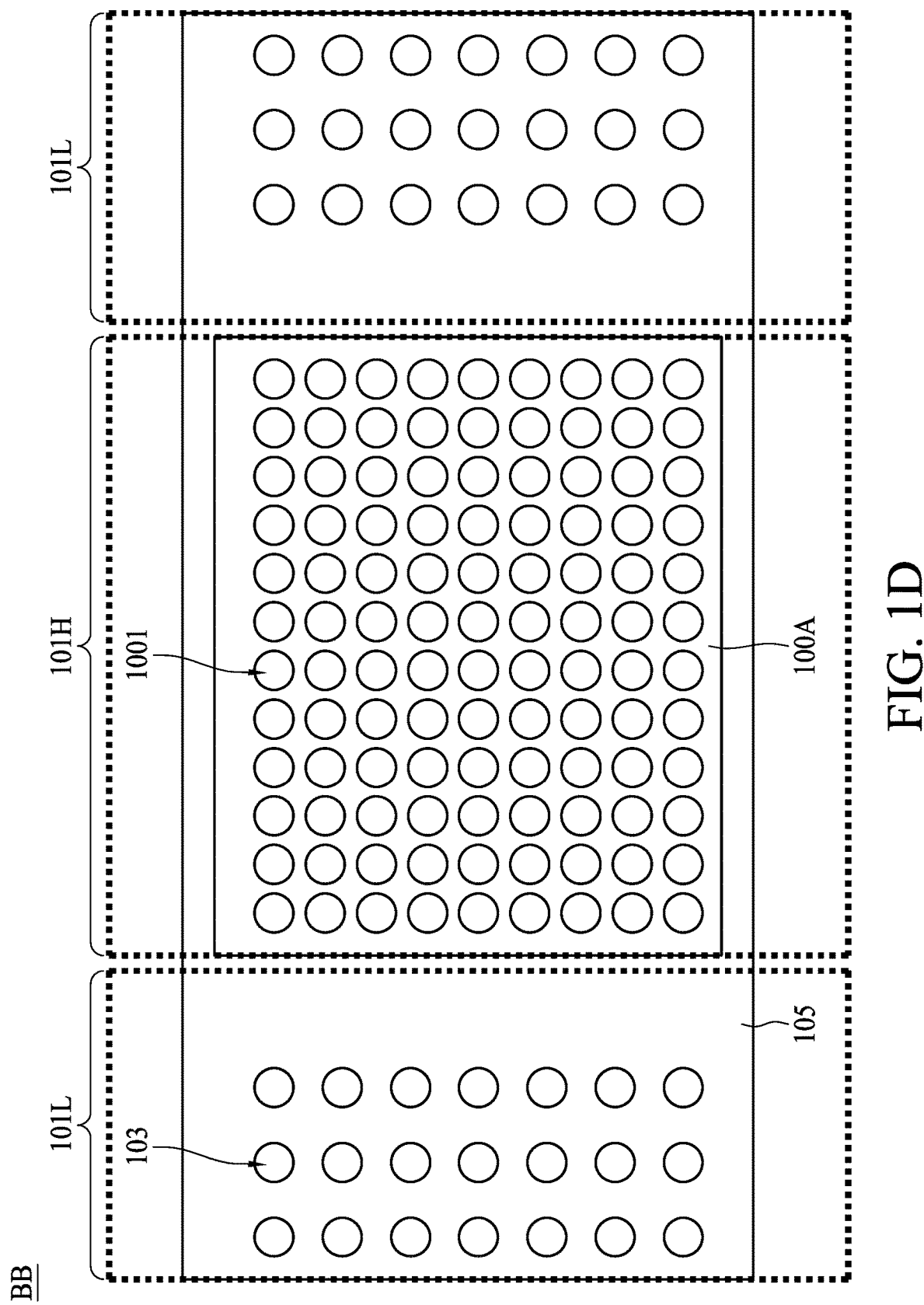
FIG. 1D illustrates a top perspective of a lower package along line BB in FIG. 1B, according to some embodiments of the present disclosure.

Referring to FIG. 1B, FIG. 1C, and FIG. 1D, FIG. 1C illustrates a bottom perspective of the second package 1072 along line AA in FIG. 1B, and FIG. 1D illustrates a top perspective of the first package along line BB in FIG. 1B, according to some embodiments of the present disclosure. Active surface 200A of the second semiconductor die 200 is facing the active surface 100A of the first semiconductor die 100, in other words, the second package 1072 is face-to-face stacked with the first package 1071. In FIG. 1C, conductive bumps 2001 on the active surface 200A, as illustrated, can be grouped into a high bump density region 201H and a low bump density region 201L. As previously discussed, high bump density region 201H may possess a greater number of conductive bumps 2001 per area than the low bump density region 201L. In FIG. 1D, conductive bumps 1001 on the active surface 100A and the conductive elements 103 encapsulated by the molding compound 105, as illustrated, can be grouped into a high bump density region 101H and a low bump density region 101L. As previously discussed, high bump density region 101H may possess a greater number of conductive bumps 1001 per area than the low bump density region 101L, where the conductive element 103 may be referred as a conductive bump in the present disclosure.

Referencing FIG. 1C and FIG. 1D, in some embodiments, the conductive bumps 2001 in the high bump density region 201H corresponds to the pattern of the conductive bumps 1001 in the high bump density region 101H. For example, conductive bumps 2001 in the high bump density region 201H showing a 12 by 9 array in FIG. 1C, and conductive bumps 1001 in the high bump density region 101H also showing a 12 by 9 array in FIG. 1D. However, in some other embodiment, the exact number or bumps may not be identical in the active surface 200A and active surface 100A. At least a portion of the conductive bumps on either of the active surface 200A and active surface 100A matches the pattern of a portion of the conductive bumps on its counterpart. On the other hand, conductive bumps 2001 in the low bump density region 201L substantially corresponds or partially matches the pattern of the conductive bumps 1001 in the low bump density region 101L. For example, conductive bumps 2001 in the low bump density region 201L showing a 4 by 6 array in FIG. 1C, and conductive bumps 1001 in the low bump density region 101L showing a 3 by 6 array in FIG. 1D. Alternatively stated, at least a portion of the conductive bumps in the low bump density region 201L matches the pattern of a portion of the conductive elements 103.

Figure 2A:
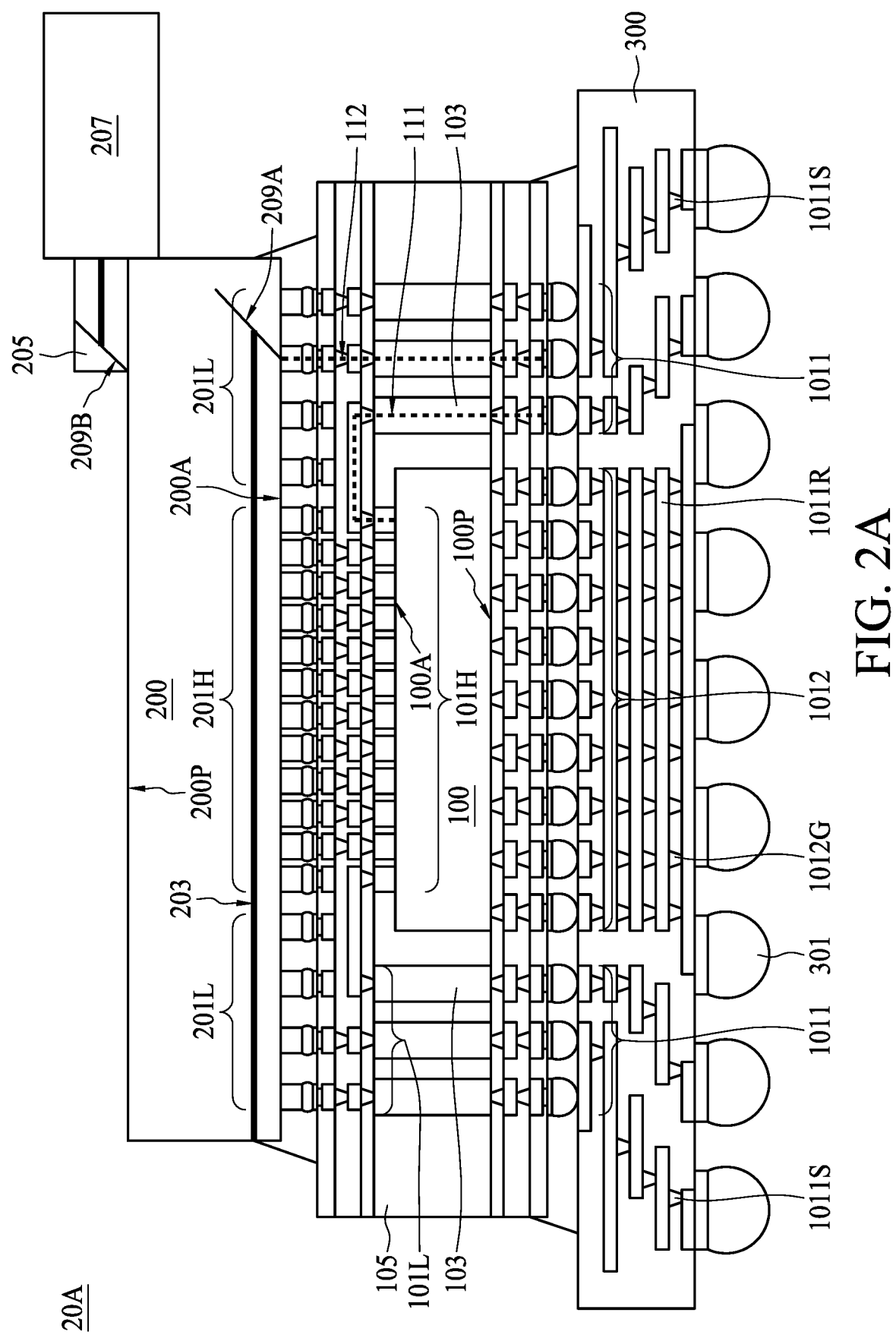
FIG. 2A illustrates a cross-sectional view of a semiconductor package structure according to some embodiments of the present disclosure.

Referring to FIG. 2A, FIG. 2A illustrates a cross-sectional view of a semiconductor package structure 20A according to some embodiments of the present disclosure. The second semiconductor die 200 in the semiconductor package structure 20A can be a PIC having a waveguide layer 203, for example, disposed in proximity to the active surface 200A. The semiconductor package structure 20A further includes an optical fiber 207 optically coupled to the waveguide layer 203 through, for example, a pair of reflectors 209A, 209B, and a coupler 205. As shown in FIG. 2A, the optical fiber 207 is disposed over a passive surface 200P of the second semiconductor die 200. Reflector 209A can be machined in the body of the second semiconductor die 200 by a MEMS procedure so as to alter the optical path from a horizontal direction to a vertical direction, for example. The optical path is then altered again at the reflector 209B machined in the coupler 205 from a vertical direction to a horizontal direction, and subsequently propagating into the optical fiber 207. To reduce optical loss, boundaries between the passive surface 200P of the second semiconductor die 200 and the coupler 205 may father include a layer of anti-reflective coating (ARC) (not shown).

Figure 2B:
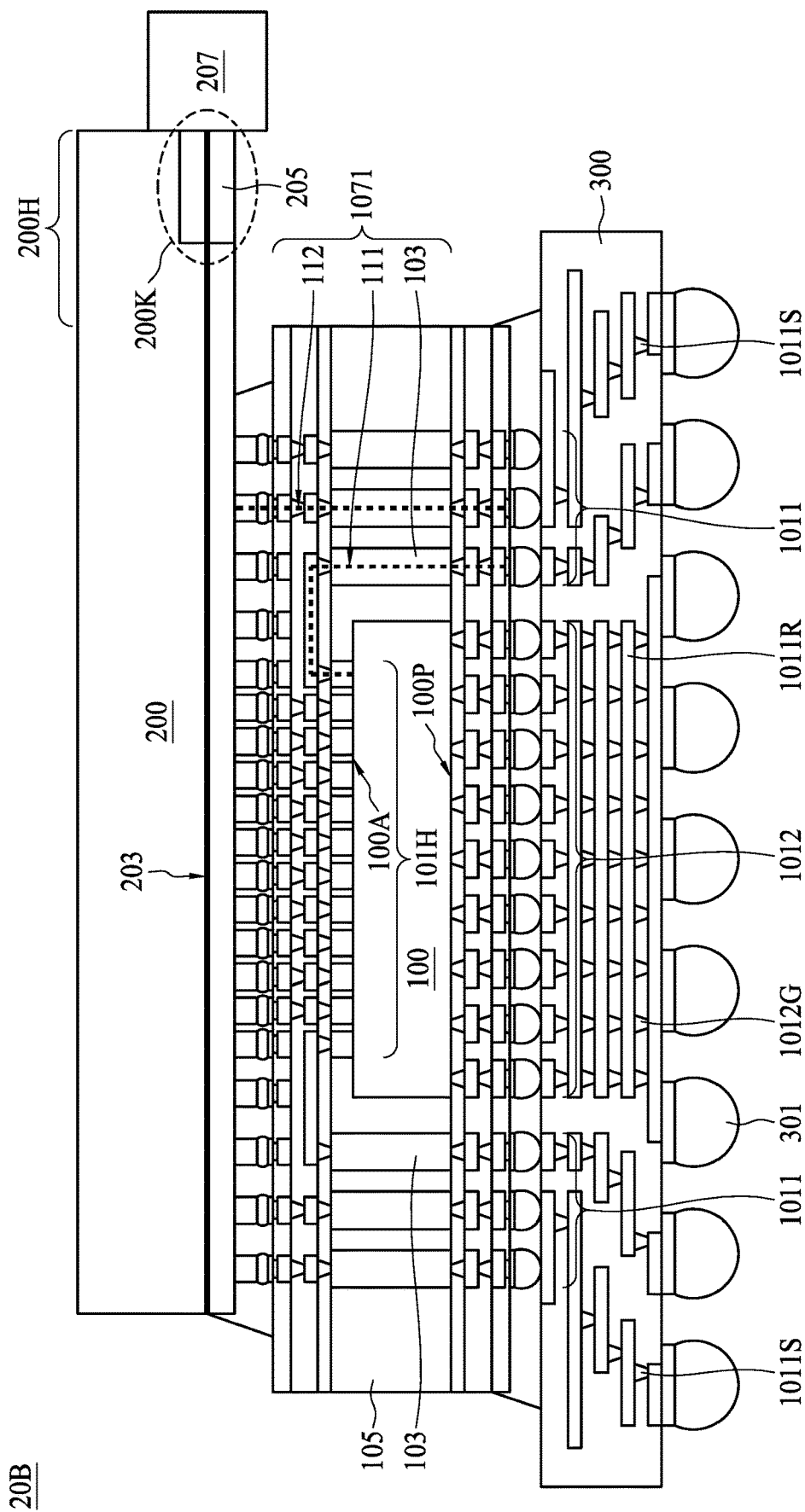
FIG. 2B illustrates a cross-sectional view of a semiconductor package structure according to some embodiments of the present disclosure.

Referring to FIG. 2B, FIG. 2B illustrates a cross-sectional view of a semiconductor package structure 20B according to some embodiments of the present disclosure. Semiconductor package structure 20B may be substantially similar to the semiconductor package structure 20A except that the optical fiber 207 optically couples to the waveguide 203 from a lateral direction through an overhang portion 200H of the second semiconductor die 200. The overhang portion 200H of the second semiconductor die 200 can be an edge portion hanging over a sidewall of the first package 1071. Since the coupler 205 may be leveled with the waveguide layer 203, a kink 200K is machined at the active surface 200A of the second semiconductor die 200, or the PIC, in order to accommodate the coupler 205 which attached to the optical fiber 207. Fabrication of the second semiconductor die 200 may include dicing a PIC wafer into individual PIC units with sufficient width and subsequently aligning PIC unit with the first package 1071 to form the overhang portion 200H.

Figure 3:
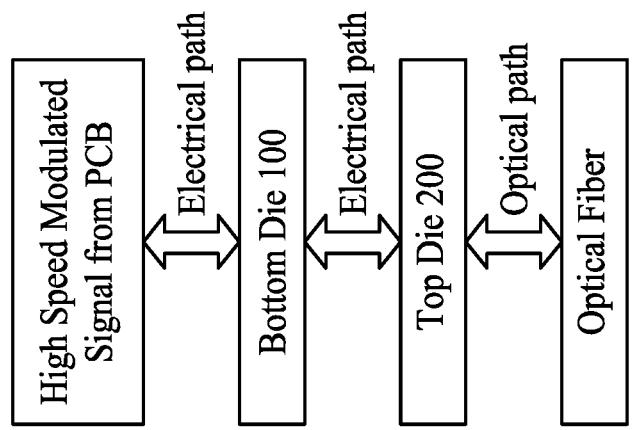
FIG. 3 illustrates a functional diagram representing signal transmission according to some embodiments of the present disclosure.

Referring to FIG. 3, FIG. 3 illustrates a functional diagram representing high speed modulated signal transmission according to some embodiments of the present disclosure. High speed modulated signal, for example, may possess a data rate of about 100 Gbit/s, 400 Gbit/s, or 1.6 Tbit/s. The signal transmission path can be described according to the semiconductor package structure 10A of FIG. 1A. Electronic signal can be entered into the semiconductor package structure 10A through conductive terminals 301, for example, solder bumps, connecting to an underlying external electronic apparatus like a printed circuit board (PCB) (not illustrated). The electronic signal enters IC1, which may be the first semiconductor die 100, through the signal lines 1011S in the substrate 300, the conductive traces 1012R of the RDL 101R, the conductive elements 103, the conductive trace 1020, and conductive bumps 1001 in the high bump density region 101H of the first package 1071 (labeled in FIG. 1B). In some embodiments, the electronic signal may be amplified by suitable electronic components in the first semiconductor die 100A and further entering IC2, which may be the second semiconductor die 200, through the conductive traces 1021R of the RDL 102R and the conductive bumps 2001 in the high bump density region 201H. The electronic signal may then further converted to optical signal in the PIC and entering optical fiber 207.

Alternatively, optical signal in PIC may be converted into electronic signal and following the conductive path previously described in an inverted direction, including, but not limited to, optical fiber 207, IC2, which may be the second semiconductor die 200, conductive bumps 2001 in the high bump density region 201H, conductive traces 1021R of the RDL 102, conductive bumps 1001 in the high bump density region 101H of the first package 1071, IC1, which may be the first semiconductor die 100, the conductive trace 1020, the conductive elements 103, the conductive traces 1012R of the RDL 101R, the signal lines 1011S in the substrate 300, and conductive terminals 301 of the substrate 300.

In addition to the high speed signal transmission paths, the semiconductor package structure 10A may also include signal transmission path transmitting signal rate at a level lower than 100 Gbit/s, 400 Gbit/s, or 1.6 Tbit/s. Those signal transmission path includes, but not limited to, signal lines 1011S in the substrate 300, the conductive traces 1012R of the RDL 101R, the conductive elements 103, the conductive trace 1020', and conductive bumps 2001 in the low bump density region 201L of the second package 1072 (labeled in FIG. 1B). Alternatively, the aforesaid transmission path may following the conductive path previously described in an inverted direction, including, but not limited to, conductive bumps 2001 in the low bump density region 201L, conductive traces 1020' of the RDL 102, the conductive elements 103, the conductive traces 1012R of the RDL 101R, the signal lines 1011S in the substrate 300, and conductive terminals 301 of the substrate 300. In some embodiments, the aforesaid transmission path may include power line or ground line by designing the wiring pf conductive traces in RDL 101R. For example, some conductive traces 1012R may be coupled to the conductive traces 1011R prior to entering the substrate 300.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package structure, comprising:
   a first semiconductor die having an active surface and a passive surface opposite to the active surface;
   a conductive element leveled with the first semiconductor die;
   a first redistribution layer (RDL) being closer to the passive surface than to the active surface;
   a second RDL being closer to the active surface than to the passive surface; and
   a second semiconductor die over the second RDL and electrically coupled to the first semiconductor die through the second RDL,
   wherein a first conductive path is established among the first RDL, the conductive element, the second RDL, and the active surface of the first semiconductor die, and wherein the second semiconductor die electrically coupled to the first semiconductor die through a high bump density region of the second semiconductor die.

2. The semiconductor package structure of claim 1, wherein the second semiconductor die further electrically coupled to the first RDL through a low bump density region of the second semiconductor die.

3. The semiconductor package structure of claim 1, wherein a conductive pattern of the high bump density region of the second semiconductor die substantially matches a conductive pattern of a high bump density region of the first semiconductor die at the active surface.

4. The semiconductor package structure of claim 1, wherein the second semiconductor die comprises a waveguide layer.

5. The semiconductor package structure of claim 1, wherein the passive surface of the first semiconductor die is aligned with a bottom surface of the conductive element.

6. The semiconductor package structure of claim 1, further comprising:
a substrate at a side of the passive surface of the first semiconductor die; and
a first conductive terminal connecting the substrate and the first RDL,
wherein the conductive path further includes the first conductive terminal.

7. The semiconductor package structure of claim 6, further comprising a second conductive terminal under a projected area of the first semiconductor die and connected to the first RDL.

8. The semiconductor package structure of claim 7, wherein the second conductive terminal is electrically coupled to a ground line or a floating line of the substrate.

9. The semiconductor package structure of claim 8, wherein the first conductive terminal is electrically coupled to a signal line of the substrate.

10. A semiconductor package structure, comprising:
a first semiconductor die having an active surface and a passive surface opposite to the active surface;
a conductive element leveled with the first semiconductor die;
a first redistribution layer (RDL) being closer to the passive surface than to the active surface;
a second RDL being closer to the active surface than to the passive surface; and
a second semiconductor die over the second RDL and electrically coupled to the first semiconductor die through the second RDL,
wherein the second semiconductor die comprises a waveguide layer, and
wherein an active surface of the second semiconductor die comprises a high bump density region projectively over the first semiconductor die.

11. The semiconductor package structure of claim 10, wherein the active surface of the second semiconductor die further comprises a low bump density region projectively over the conductive element.

12. The semiconductor package structure of claim 10, wherein the second semiconductor die overhangs from the second RDL.

13. The semiconductor package structure of claim 10, further comprising an optical fiber optically coupled to the waveguide layer of the second semiconductor die.

14. The semiconductor package structure of claim 13, wherein the optical fiber is disposed over the second semiconductor die.

15. A fan-out package structure, comprising:
a substrate;
a first package over the substrate, the first package comprising:
a first semiconductor die;
a fan-out redistribution layer (RDL) electrically coupled to an active surface of the first semiconductor die;
a high bump density region on the first semiconductor die; and
a low bump density region adjacent to the first semiconductor die,
wherein the fan-out RDL electrically couples the high bump density region and the low bump density region; and
a second package over the first package, wherein the second package comprises:
a semiconductor die;
a high bump density region at an active surface of the second semiconductor die, corresponding to the high bump density region of the first package; and
a low bump density region at the active surface of the second semiconductor die, corresponding to the low bump density region of the first package.

16. The fan-out package structure of claim 15, wherein the second package comprises a photonic integrated circuit.

17. The fan-out package structure of claim 15, wherein the low bump density region of the first package comprises a conductive element.

18. The fan-out package structure of claim 15, further comprising conducive terminals between the first package and the substrate, electrically coupling the active surface of the first semiconductor die to the substrate.

* * * * *